United States Patent [19]
Bryson et al.

[11] Patent Number: 5,377,202
[45] Date of Patent: Dec. 27, 1994

[54] METHOD AND APPARATUS FOR LIMITING PIN DRIVER OFFSET VOLTAGES

[75] Inventors: Stephen W. Bryson; Alan T. Kondo, both of Cupertino; Don N. Lee, San Jose, all of Calif.

[73] Assignee: Raytheon Company, Lexington, Mass.

[21] Appl. No.: 56,097

[22] Filed: May 3, 1993

[51] Int. Cl.[5] .................. G05B 23/02; G01R 15/08
[52] U.S. Cl. .................................. 371/27; 324/73.1; 364/579
[58] Field of Search ............... 324/73.1, 537; 364/579, 364/580; 371/25.1, 27

[56] References Cited

U.S. PATENT DOCUMENTS

| | | | |
|---|---|---|---|
| Re. 31,056 | 10/1982 | Chau et al. ................ | 371/25.1 X |
| 4,070,565 | 1/1978 | Borrelli ...................... | 364/580 X |
| 4,439,858 | 3/1984 | Petersen .................... | 371/27 X |
| 4,455,654 | 6/1984 | Bhaskar et al. ............ | 371/226 X |
| 4,500,993 | 2/1985 | Jacobson .................... | 371/27 X |
| 4,583,223 | 4/1986 | Inoue et al. ................ | 324/73.1 X |
| 4,635,259 | 1/1987 | Schinabeck et al. ...... | 364/579 X |
| 4,637,020 | 1/1987 | Schinabeck ................ | 364/579 X |
| 4,646,299 | 2/1987 | Schinabeck et al. ...... | 364/579 X |
| 4,724,378 | 2/1988 | Murray et al. ............. | 371/27 |
| 4,807,161 | 2/1989 | Comfort et al. ........... | 364/571.01 X |
| 4,837,502 | 6/1989 | Ugenti ....................... | 324/537 X |
| 5,202,639 | 4/1993 | McKeon et al. ........... | 324/537 |

*Primary Examiner*—Edward R. Cosimano
*Attorney, Agent, or Firm*—W. Clark

[57] ABSTRACT

A test equipment pin driver having a main output channel including a pulse forming circuit, a buffer and an output amplifier connected in series. The pulse forming circuit provides pulses that are timed to a data input signal, and the buffer passes the pulses to the amplifier which produces driver pulses adapted to be transmitted to a device under test. The high and low voltage levels of the driver pulses are made substantially the same as programmed high and low voltages by providing scaled replicas of the buffer and amplifier, and using closed loop compensation to accurately drive the replica outputs to the high and low programmed voltages, respectively. The replicas mirror the DC performance of the buffer and amplifier of the main output channel, and clamping voltages are provided from the closed loops to enable operation of the main output channel in a manner that produces driver pulses with the programmed high and low voltage levels.

10 Claims, 2 Drawing Sheets

METHOD AND APPARATUS FOR LIMITING PIN DRIVER OFFSET VOLTAGES

BACKGROUND OF THE INVENTION

The field of the invention generally relates to test equipment pin drivers that produce driver pulses to test a device under test, and more particularly relates to an offset compensation circuit that limits output offset voltages in such pin drivers.

As is well known, the role of a pin driver in typical automatic test equipment (ATE) system is to send driver pulses having the correct voltages and timing to a device under test (DUT). One of the important parameters of such driver pulses is the offset voltage which is here defined as the difference between a high or low pulse voltage level VOH or VOL and the corresponding programmed or intended voltage level. In particular, the lower level VOL offset is the difference between the actual pulse voltage VOL in the lower or baseline level and the programmed lower voltage VL which is the intended magnitude origin line. Similarly, the upper level VOH offset is the difference between the actual pulse voltage VOH in the upper level and the programmed upper voltage VH. Offset voltages define driver pulse DC level errors and result in the pin of the device under test being either under or over driven. In most ATE systems, offset voltages higher than 30 millivolts requires automatic calibration which takes up valuable test time. Therefore, it is an important objective in ATE design to have extremely small offset voltages that are well within acceptable tolerances. That is, it is important to have accurate correspondence between the high and low voltage levels of the driver pulses and their corresponding programmed voltage levels VH and VL.

A prototype pin driver was built to include a pulse forming section, a buffer, and an amplifier connected in series. The pulse forming section received a data input and, in response thereto, provided output pulses timed in accordance with the data input. That is, the delay, width, and period of the output pulses were determined by the timing or transitions of the data input. The amplifier stage of the pin driver required a significant amount of input bias current. Therefore, in order to keep the amplifier output driver pulse parameters independent of the load, a buffer was connected between the pulse forming section and the amplifier. Without the buffer, the slew rate of the pulse forming section pulses would have been undesirably dependent upon the loading on the output of the amplifier. The slew rate is here defined as $60\%(VOH-VOL)/T_R$ where $T_R$ is the rise time between 20% and 80% values of (VOH-VOL).

In the above described prototype pin driver, clamp diodes were connected to a node at the input of the buffer to set the high and low voltage levels of the pulses in that stage. In particular, each diode was connected through an emitter to base junction of a respective emitter follower transistor to respective programmed high and low reference voltages VH and VL. The polarities of the clamping diodes were arranged with the intent that one would be forward biased and thereby clamp when the node rose to VH, and the other would be forward biased and thereby clamp when the node dropped to VL. The voltage drops across the respective clamping diodes were to be compensated by the voltage drops across the emitter to base junctions of the respective transistors. The above described prototype was tested, and it was determined that improvement in offset voltage was desirable.

SUMMARY OF THE INVENTION

In accordance with the invention, a circuit comprises pulse forming means responsive to a data input signal for providing a pulsed output in accordance with the data input signal. An output amplifier is responsive to the pulsed output of the pulse forming means for providing driver pulses that are adapted for transmission to a device under test. The circuit further includes closed loop means replicating the output amplifier and responsive to a reference voltage for clamping a node between the pulse forming means and the output amplifier to produce driver pulses with either a high or low voltage level substantially the same as the reference voltage. It is preferable that the circuit further include a buffer coupled between the node and the output amplifier, and that the closed loop means comprises a replicating buffer and amplifier that are scaled to the buffer and amplifier of the main output channel. In a preferred embodiment, the closed loop means further comprises an operational amplifier that receives the fed back output of the replicating amplifier and the reference voltage, and, in response thereto, drives the replicating amplifier. It is also preferable that the circuit further include a second closed loop means responsive to a second reference voltage wherein one of the closed loop means provides a clamping voltage for the lower level of the driver pulses and the other closed loop means provides a clamping voltage for the higher level of the driver pulses.

With such arrangement, scaled replicas of the main channel buffer and amplifier are provided, and their output voltages are compared to programmed reference voltage levels VH and VL. By closed loop feed back, voltage adjustments are made to drive the outputs of the replicas to VH and VL. Because the replicas faithfully mirror the DC performance of the buffer and output amplifier of the main output channel, compensated voltages within the closed loop circuits are used to provide clamping voltages for the operation of the main output channel in the same DC manner. Thus, using a closed loop compensation technique which is not practical for the main output channel, high and low voltage levels of output driver pulses are accurately regulated to VH and VL thereby virtually eliminating offset voltages. Further, drifts in offset voltages as a result of time, temperature, supply voltage, etc. are also virtually eliminated because the replicas track the programmed voltages VH and VL, and provide compensation for the main output channel. The net result is a pin driver circuit that has exceptionally low output offset, low output drift characteristics, and low gain errors.

BRIEF DESCRIPTION OF THE DRAWINGS

The foregoing objects and advantages will be more fully understood by reading the following description of the preferred embodiment with reference to the drawings wherein.

DESCRIPTION OF THE PREFERRED EMBODIMENT

Figure 1:
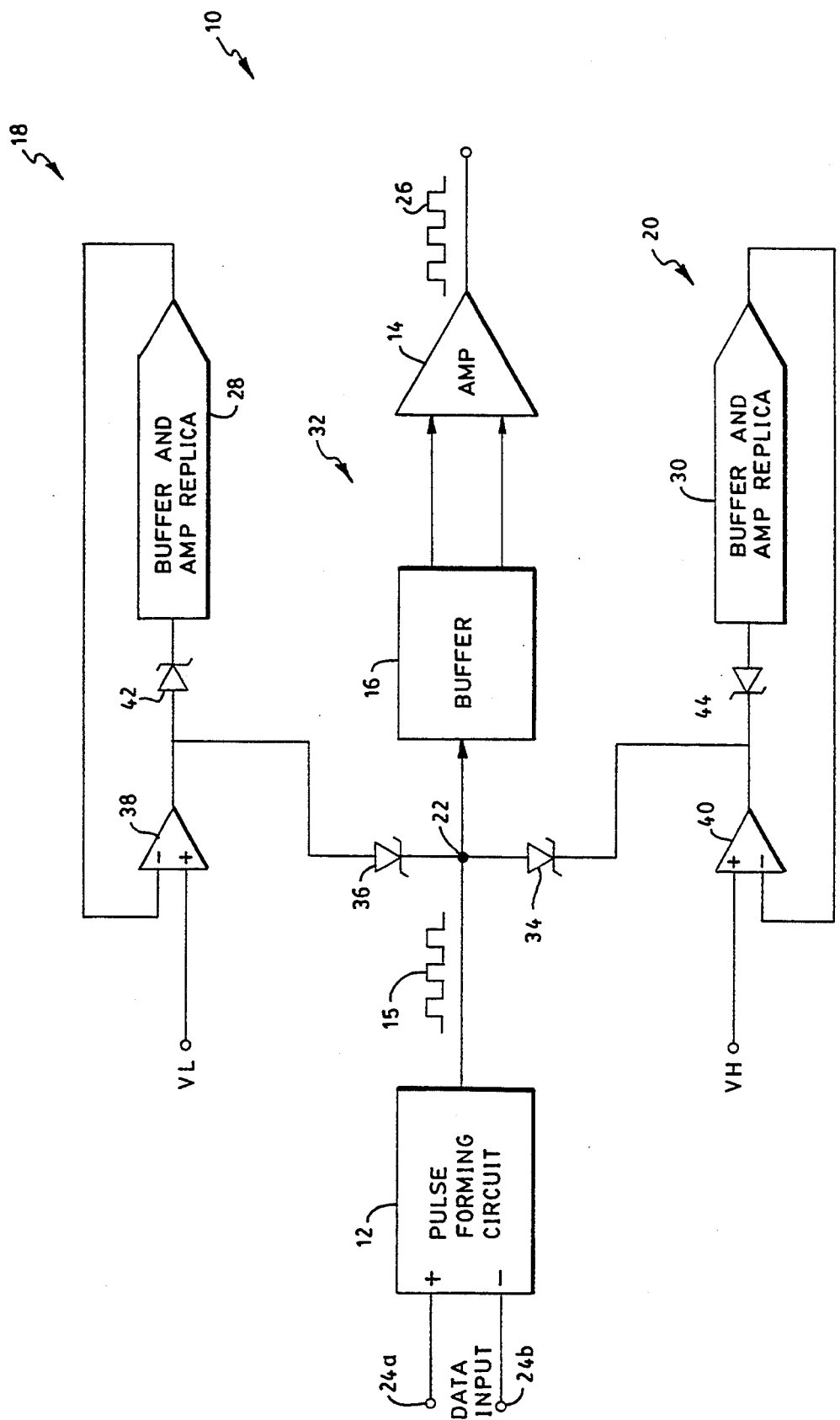
FIG. 1 is a block diagram showing a pin driver circuit in accordance with the invention.

Referring to FIG. 1, a pin driver circuit 10 includes a pulse forming circuit 12 that is responsive to a data input signal to provide a pulsed output 15 in accordance with the data input signal. Circuit 10 further includes an output amplifier 14 that, through buffer 16, is responsive to the pulsed output 15 of the pulse forming circuit 12, and provides output driver pulses 26. A closed loop circuit 18 or 20 replicating the output amplifier 14 and buffer 16 is responsive to a reference voltage VL or VH for clamping a node 22 to produce driver pulses 26 that have a voltage level that is substantially the same as the reference voltage VL or VH. Preferably, two closed loop circuits 18 and 20 are used wherein one 18 is used to provide a clamping voltage for the low level of driver pulses 26, and the other 20 is used to provide a clamping voltage for the high level of driver pulses 26.

More specifically, the data input has complementary states that are provided in conventional manner, and input to pulse forming circuit 12 on lines 24a and 24b. For example, the complementary states of the input data may switch at a rate of 100 MHz. In response thereto, pulse forming circuit 12 generates or forms pulses 15 that are timed in accordance with the data input. That is, the delay, width, and period of the pulses 15 from the pulse forming circuit 12 are determined by the timing of data input pulses. The high and low voltages of the pulses 15 are clamped in response to high and low programmed reference voltages VH and VL at node 22 in a manner to be described, and then the pulses are coupled to buffer 16. Buffer 16 functions to keep the parameters of output driver pulses 26 independent of the load. More specifically, amplifier 14 requires a significant amount of input bias current; therefore, without buffer 16, the slew rate of the pulse forming circuit 12 output signal would be dependent upon the loading on the output of the amplifier 14. Complementary outputs of buffer 16 are coupled to amplifier 14 that provides the drive for driver pulses 26.

In order to provide good high speed performance, buffer 16 and amplifier 14 use open loop circuitry to process the pulses 15 from the pulse forming circuitry 12 to the device under test. In particular, there is an inherent phase shift in closed loop circuits which would cause ringing and other instability problems for signals with rise times under 2.0 nanoseconds. Further, the loads presented by the device under test are unknown, and in some ATE equipment there are times when output amplifier 14 is turned off; these conditions make the use of a closed loop circuit even less feasible. However, in order to obtain the benefit of a closed loop compensation arrangement to eliminate or substantially limit offset voltage errors between the high and low voltage levels of output driver pulses 26 and their respective programmed voltage reference levels VH and VL, closed loop circuits 18 and 20 are coupled through respective diodes 34 and 36 to node 22. More particularly, replicas 28 and 30 are scaled versions of buffer 16 and output amplifier 14 of the main output channel 32, and each is fabricated on the same integrated circuit with the main output channel 32. Thus, the characteristics and performance relating to fabrication processes, materials, operating temperature, etc. are matched. The only difference between replicas 28 and 30 and buffer 16 and output amplifier 14 is that they may preferably be a smaller scale to conserve circuit area and power consumption.

A closed loop compensation arrangement is used in channels or circuits 18 and 20. In particular, it is noted that the parameters leading to the use of open loop circuitry for the main output channel 32 are not present in circuits or channels 18 and 20. Each has a constant DC input, VL or VH, and neither drives an unknown or varying load. The outputs of replicas 28 and 30 are fed back in a closed loop arrangement to the respective negative inputs of operational amplifiers 38 and 40, and the respective positive inputs are fed by the programmed low and high reference voltage levels VL and VH. The inputs of operational amplifiers 38 and 40 tend to equalize, so the outputs of operational amplifiers 38 and 40 produce inputs to respective replicas 28 and 30 that cause their output to go to VL and VH, respectively. In other words, operational amplifiers 38 and 40 function to compare the outputs of replicas 28 and 30 with the respective programmed voltages VL and VH to produce compensation or adjusted voltages that drive the outputs of replicas 28 and 30 to VL and VH, respectively.

The outputs of operational amplifiers 38 and 40, in addition to being coupled through diodes 42 and 44 to respective replicas 28 and 30, are used as clamping voltages for Schottky diodes 36 and 34, respectively. More specifically, as the voltage at node 22 rises to the voltage of the output of operational amplifier 40, Schottky diode 34 becomes forward biased, and clamps the voltage of node 22 to the output voltage of operational amplifier 40, less the voltage drop across Schottky diode 34. Similarly, as the voltage at node 22 drops to the voltage at the output of operational amplifier 38, Schottky diode 36 becomes forward biased, and clamps the voltage of node 22 to the output voltage of operational amplifier 38, plus the voltage drop across Schottky diode 36.

The voltage drops across diodes 34 and 44 are the same, as are the voltage drops across diodes 36 and 42. Thus, the high and low voltage level inputs to buffer 16 in the main output channel 32 are the same as the respective inputs to replicas 30 and 28. Because the DC performance of replicas 30 and 28 are matched or mirrored to buffer 16 and amplifier 14 of the main output channel 32, the high and low output levels of output driver pulses 26 are substantially the same as the outputs of replicas 30 and 28, respectively. That is, the high and low voltages levels of output driver pulses 26 are accurately compensated or adjusted by closed loop circuits 20 and 18 to be substantially the same as the high and low programmed voltage levels VH and VL. Thus, by definition, the offset voltages of the pin driver circuit 10 are virtually eliminated or, at least, limited to acceptable tolerances.

Summarizing, closed loop feed back compensation around the main output channel 32 is not practical for attaining low offset voltages. However, by using scaled replicas 28 and 30 of buffer 16 and output amplifier 14, and adding on-chip operational amplifiers 38 and 40, closed loop DC compensation is provided for the replicas 28 and 30. That is, the output voltages of replicas 28 and 30 are compared to the programmed reference voltage levels VH and VL, and voltage adjustments are made to drive the outputs of replicas 28 and 30 to VL and VH, respectively. Because the replicas faithfully mirror the DC performance of the buffer 16 and output amplifier 14 of the main output channel 32, the compensated voltages of the closed loop circuits 18 and 20 are used to provide clamping voltages for operating the main output channel in the same DC manner. Thus, using a closed loop compensation technique external to the main output channel 32, the high and low voltage levels of output driver pulses 26 are accurately regulated to VH and VL thereby virtually eliminating offset voltages. Further, drifts in offset voltages as a result of time, temperature, supply voltage, etc. are also virtually eliminated because the replicas 28 and 30 track the programmed voltages VL and VH, and provide compensation for the main output channel 32. The net result is a pin driver circuit 10 that has exceptionally low output offset, low output drift characteristics, and low gain errors.

Figure 2:
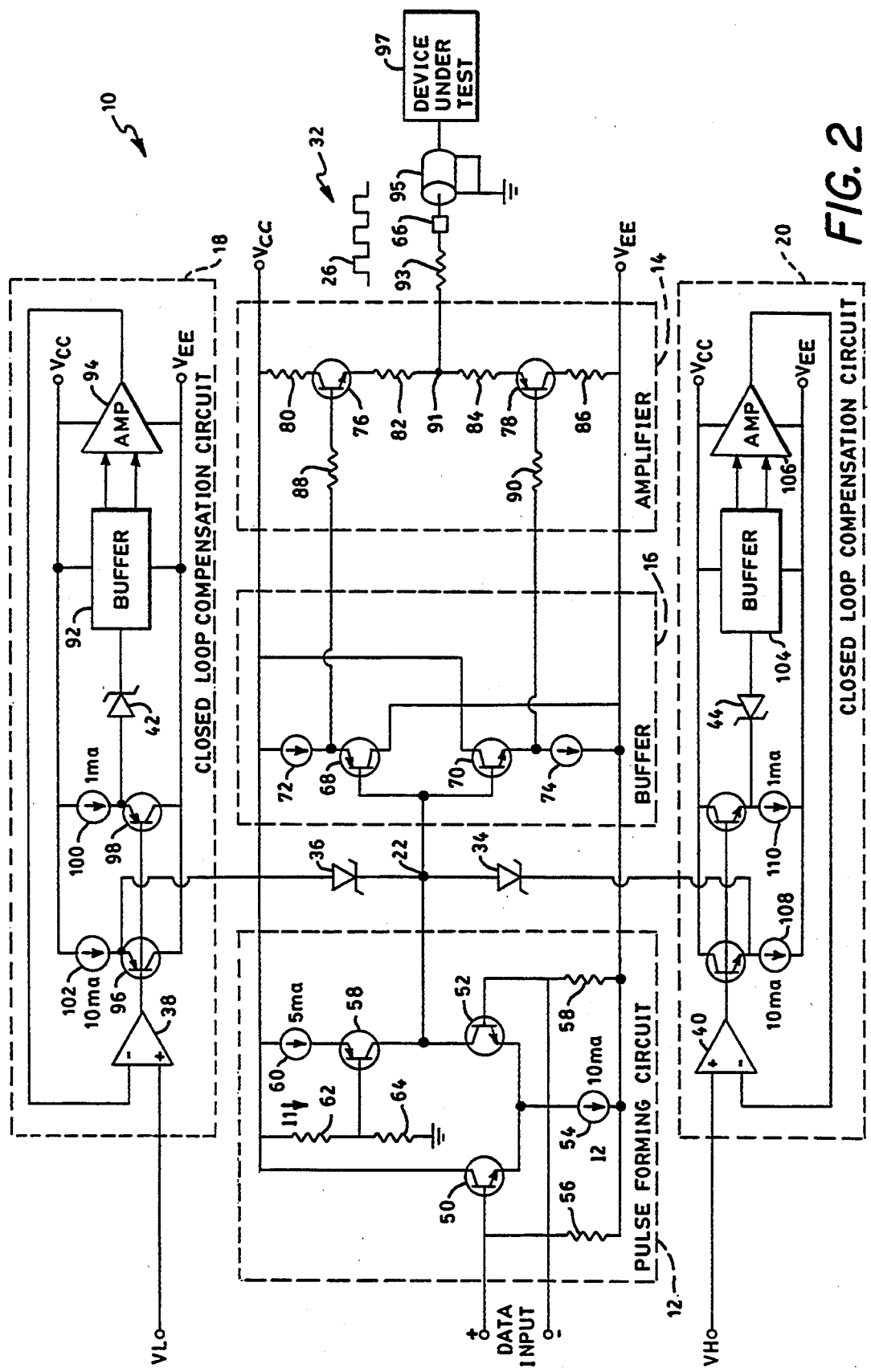
FIG. 2 is a simplified circuit showing an implementation of the block diagram of FIG. 1.

Referring to FIG. 2, a simplified circuit implementation of FIG. 1 is shown. Pulse forming circuit 12 includes a differential pair of transistors 50 and 52 with emitters connected in common through 10 milliamp current source 54 to $V_{EE}$. The data input lines 24a and 24b are connected to the respective bases of transistors 50 and 52, and also through respective resistors 56 and 58 to $V_{EE}$. The collector of transistor 50 is connected to $V_{cc}$, and the collector of transistor 52 is connected through transistor 58 and 5 milliamp current source 60 to $V_{cc}$. Resistors 62 and 64 provide a voltage divider from $V_{cc}$ to ground to bias the base of transistor 58. When the data input on line 24a is high making line 24b low, transistor 52 is turned off, and the node 22 which is connected to the collector of transistor 52 is charged positively by current flowing through transistor 58. When the voltage of node 22 exceeds the voltage on the cathode of Schottky diode 34, diode 34 becomes forward biased and clamps the voltage at node 22 to the cathode voltage plus the diode drop. The generation of the cathode voltage for Schottky diode 34 will be described later herein. The rate at which the voltage on node 22 rises is the slew rate, and is determined by the values of current source 60 and the node capacitance (Cn) and is equal to:

Positive slew rate $= I1/Cn$

For example, with current equal to 5 milliamps as shown and a Cn of 2 picafarads, the slew rate of the positive edge is approximately of 2.5 volts per nanosecond.

When the data input on line 24a goes low making line 24b high, transistor 52 turns on and its collector sinks 10 milliamps as determined by current source 54. In this example, 5 milliamps is taken up by the collector current of transistor 58, and 5 milliamps is used to discharge node 22. The voltage at node 22 starts to decrease linearly with a slew rate that is equal to the positive slew rate. That is, the positive and negative slew rates are equal because the charging and discharging currents are both 5 milliamps and Cn is the same for both output pulse transitions. When the voltage at node 22 decreases below the voltage on the anode of Schottky diode 36, diode 36 becomes forward biased and clamps the voltage at node 22 to the anode voltage minus the diode drop. Thus, the timing of pulses at node 22 at the output of the pulse forming circuit 12 is determined by the timing of data input pulses on lines 24a and 24b. That is, the delay, width, and period of the pulse forming circuit 12 pulses are determined by the timing of the data input. The amplitudes of the high and low levels of the pulses are determined by closed loop compensation circuits 18 and 20 in a manner to be described in detail later herein.

As a result of clamp diodes 34 and 36, current sources 54 and 60, closed loop compensation circuits 18 and 20, and differential transistor pair 50 and 52, the signal or output generated by the pulse forming circuit 12 has the voltage levels, polarity, and timing that is required at the output terminal 66 of pin driver circuit 10. However, the output of the pulse forming circuit 12 must be buffered because the output amplifier 14 of the pin driver circuit 10 requires a significant amount of input bias current. Without buffer 16, the slew rate of the pulses out of the pulse forming circuit 12 would be dependent upon the loading on the output of amplifier 14. In order to keep the parameters of driver pulses 26 independent of the load, the output of the pulse forming circuit 12 is buffered by buffer 16 which includes transistors 68 and 70, and current sources 72 and 74. In particular, node 22 is coupled to the bases of respective transistors 68 and 70. Current source 72 is connected from $V_{cc}$ to the emitter of transistor 68 and the collector is connected to $V_{EE}$. $V_{cc}$ is also connected to the collector of transistor 70 and the emitter is coupled through current source 74 to $V_{EE}$. Transistors 68 and 70 are thus connected as emitter followers that buffer amplifier 14 which includes transistors 76 and 78. In addition, transistors 68 and 70 also provide first order base emitter voltage compensation for transistors 76 and 78, respectively. As a result, the pulse signals progress from the pulse forming circuit 12 to the pin driver output 66 with very little change in voltage levels, slew rates, and timing.

Amplifier 14 is a complementary emitter follower including transistors 76 and 78. The collector of npn transistor 76 is coupled through resistor 80 to $V_{cc}$, and the emitter is coupled through resistors 82 and 84 to the emitter of pnp transistor 78. The collector of transistor 78 is connected through resistor 86 to $V_{EE}$. The base of transistor 76 receives its bias from the emitter of pnp transistor 68 through resistor 88, and the base of transistor 78 receives its bias from the emitter of npn transistor 70 through resistor 90. Turn on base currents for transistors 76 and 78 are provided by current sources 72 and 74, respectively. Turn off base currents for transistors 76 and 78 are provided by transistors 68 and 70, respectively. The quiescent emitter currents of transistors 76 and 78 are stabilized by resistors 82 and 84.

Amplifier 14 is protected against short circuit loads by the collector resistors 80 and 86, and the emitter resistors 82 and 84. These resistors limit the peak currents in transistors 76 and 78, and also cause the collectors to saturate for currents exceeding 120 milliamps. Excessive base currents for transistors 76 and 78 are prevented by resistor 88 and current source 72, and resistor 90 and current source 74, respectively. In addition to the protection provided by the resistors, the pin driver circuit 10 may also have a thermal sensing circuit that monitors the substrate temperature.

Driver pulses 26 are output from node 91 between resistors 82 and 84. The driver pulses 26 are coupled through output series resistor 93 to the output terminal 66 to which transmission line 95 such as a coaxial cable is connected. The sum of the resistance value of output series resistor 93 and the output impedance at node 91 is desirably equal to the impedance of transmission line 95 to reduce reflections. Transmission line 95 is coupled to a pin of the device under test 97 to deliver the driver pulses 26.

Still referring to FIG. 2, closed loop compensation circuit 18 includes buffer 92 and amplifier 94 that are scaled replicas of buffer 16 and amplifier 14 of main output channel 32. In particular, buffer 92 and 94 are fabricated on the same integrated circuit as buffer 16 and amplifier 14 under similar process conditions and materials, and operate under the same environment conditions such as temperature. The difference between buffer 92 and buffer 16, and amplifier 94 and amplifier 14 is that the replicas are scaled versions to conserve integrated circuit area and power consumption, while still providing a replica of the DC performance of buffers 16 and amplifier 14. For example, the size of amplifier 14 may be 100 times the minimum size, while the size of amplifier 94 may be ten times minimum size. Therefore, for this example, amplifier 94 would be a scaled replica one-tenth the size of amplifier 14. The output of operational amplifier 38 is coupled to the bases of transistors 96 and 98. The emitter of transistor 98 is coupled through current source 100 to $V_{cc}$, and also through diode 42 to the input of buffer 92. The emitter of transistor 96 is coupled through current source 102 to $V_{cc}$, and also through diode 36 to node 22 as shown. The output of amplifier 94 is fed back to the negative input of operational amplifier 38, and the positive input is coupled to receive a programmed reference voltage VL which is the intended low level reference for driver pulses 26. In such configuration, the inputs to operational amplifier equalize, so the output of operational amplifier 38 provides a compensated drive voltage through the base of transistor 98 to produce an emitter voltage that causes the output of amplifier 94 to be substantially equal to reference voltage VL. The same emitter voltage of transistor 98 is provided at the emitter of transistor 96, and, with the scaled up 10 milliamp current source 102, provides current to the anode of Schottky diode 36 whose cathode is coupled to node 22 of the main output channel 32. Since the replicated VL channel or closed loop compensation circuit 18 is a 0.1 scaled version of the main output channel 32, the low level of driver pulses at the output of amplifier will also be VL.

Closed loop compensation circuit 20 is configured and operates in a manner similar to closed loop compensation circuit 18. That is, buffer 104 and amplifier 106 are scaled replicas of buffer 16 and amplifier 14, respectively. Current sources 108 and 110 sink current instead of sourcing current like current sources 100 and 102. The output of amplifier 106 is fed back to the negative input of operational amplifier 40, and compared with the programmed high voltage level VH on the positive input. Thus, closed loop compensation circuit 20 functions to clamp node 22 to a high voltage that produces driver pulses 26 at the output of amplifier 14 that have high levels substantially the same as VH.

There were two basic sources for offset voltages in the prototype discussed in the Background of the Invention. The first source resulted from a mismatch between the clamping diodes and the emitter to base junctions of the respective transistors that were intended to compensate for the voltage drops across the diodes. The mismatches caused the node to be clamped to upper and lower voltages that were different than the programmed reference voltages VH and VL. The second source resulted from size differences between transistors 68 and 70 and the corresponding amplifier transistors 76 and 78. That is, buffer 16 is designed with small transistors 68 and 70 to minimize parasitics and base currents, and thus the loading on pulse forming circuit 12. In contrast, amplifier 14 requires large transistors 76 and 78 to provide the output current capability for driving 50 ohm transmission lines which can be up to 100 milliamps. The differences in the sizes of the buffer 16 and amplifier 14 transistors lead to base to emitter mismatches due to the differing base current densities, and that translated directly to offset and drift errors. In accordance with the invention, there is automatic compensation for these sources of offset voltage. In particular, the voltage drops across diode 36 corresponds to the voltage drop across diode 42, and the voltage drop across diode 34 corresponds to the voltage drop across diode 44. Further, if there are mismatches between buffer and amplifier transistors in the main channel 32, the same differences exist on the replicas 28 and 30. VH and VL are provided as output voltage levels in the respective closed loop compensation circuits 18 and 20, so these voltages are provided as output voltages in the main channel 32.

This concludes the description of the preferred embodiment. However, a reading by one skilled in the art will bring to mind many modifications and alterations that do not depart from the spirit and scope of the invention. Therefore, it is intended that the invention be limited only by the appended claims.

What is claimed is:

1. A circuit comprising:
   pulse forming means responsive to a data input signal for providing a pulsed output in accordance with said data input signal;
   an output amplifier responsive to said pulsed output of said pulse forming means for providing driver pulses;
   first closed loop means responsive to a first reference voltage for clamping a node between said pulse forming means and said output amplifier to produce said driver pulses with a first voltage level substantially the same as said first reference voltage, said first closed loop means comprising a first replica of said output amplifier and first operational amplifier responsive to said first reference voltage and an output of said first replica wherein said first replica is responsive to said first operational amplifier, and wherein said clamping of said node is responsive to said output of said first amplifier; and
   second closed loop means responsive to a second reference voltage for clamping said node to produce said driver pulses with a second voltage level substantially the same as said second reference voltage, said second closed loop means comprising a second replica of said output amplifier and a second operational amplifier responsive to said second reference voltage and an output of said second replica wherein said second replica is responsive to said second operational amplifier, and wherein said clamping of said node is in response to said output of said second amplifier.

2. The circuit recited in claim 1 wherein said closed loop means further comprises a diode coupled between said output of said operational amplifier and said node.

3. In an automatic test equipment system adapted to produce driver output pulses to be transmitted to a pin of a device under test wherein the output driver pulses are to have a predetermined high voltage and a low voltage each within a predetermined offset from respective high and low voltage reference signals, a pin driver circuit comprising:

a main output channel comprising:
  (a) pulse forming means responsive to a data input signal for providing a pulsed output timed in accordance with said data input signal;
  (b) a buffer circuit coupled to receive said pulsed output from said pulse forming means; and
  (c) an output amplifier coupled to receive a buffered output from said buffer circuit and produce said output driver pulses; and first and second closed loop means each replicating said main channel buffer circuit and output amplifier, and being responsive to respective ones of said high and low voltage reference signals for clamping a node between said main channel pulse forming means and buffer circuit to produce output driver pulses from said main channel amplifier that have high and low voltage levels that are substantially the same as said respective high and low voltage reference signals and within said predetermined offset voltages.

4. The circuit recited in claim 3 wherein said closed loop means comprises a pair of replicated channels each responsive to a respective one of said high and low voltage reference signals, each of said replicated channels comprising a operational amplifier, a replicating buffer circuit and a replicating amplifier coupled in series wherein an output of said replicating amplifier is fed back to an input of said operational amplifier, and the respective high or low voltage reference signal is coupled to another input of said operational amplifier, said node being clamped in response to respective outputs of said operational amplifiers.

5. The circuit recited in claim 4 wherein said closed loop means further comprises clamping diodes coupled from each of said replicated channels to said node.

6. The circuit recited in claim 5 wherein each of said replicated channels is scaled to said main output channel buffer circuit and output amplifier.

7. The circuit recited in claim 5 wherein said replicated channels are scaled to said main channel by a factor of 10.

8. A circuit adapted to provide driver pulses for testing a device under test, said circuit comprising:
a main output channel comprising:
  (a) a pulse forming circuit responsive to a data input signal for forming pulses timed in accordance with said data input signal;
  (b) a buffer circuit coupled to said pulse forming circuit for providing a buffered output of said pulses; and
  (c) an output amplifier coupled to receive said buffered output from said buffer circuit and produce said driver pulses;

first replicating means for replicating DC performance of said buffer circuit and output amplifier of said main output channel;

first providing means responsive to a high reference signal and a fed-back output of said first replicating means for providing an input to said first replicating means to cause said first replicating means output to be substantially the same as said high reference signal;

means responsive to said first providing means for clamping a node between said pulse forming circuit and said buffer circuit to cause a high output level of said driver pulses of said output amplifier to be substantially the same as said high reference signal;

second replicating means for replicating DC performance of said buffer circuit and output amplifier of said main output channel;

second providing means responsive to a low reference signal and a fed-back output of said second replicating means for providing an input to said second replicating means to cause said second replicating means output to be substantially the same as said low reference signal; and means responsive to said second providing means for clamping said node to cause a low output level of said driver pulses of said output amplifier to be substantially the same as said low reference signal.

9. The circuit recited in claim 8 wherein said first and second replicating means are scaled versions of said buffer circuit and said output amplifier of said main output channel.

10. In a circuit comprising a pulse forming circuit, a buffer circuit, and an output amplifier connected in series and adapted to provide driver pulses to test a device under test, a method comprising the steps of:
providing a first scaled replica of said buffer circuit and output amplifier;
feeding back an output of said first scaled replica and comparing it with a high reference voltage to produce a first closed loop that causes said first scaled replica output to be substantially the same as said high reference voltage;
clamping a node between said pulse forming circuit and said buffer circuit to a corresponding node within said first closed loop to produce driver pulses having a first voltage level substantially the same as said high reference voltage;
providing a second scaled replica of said buffer circuit and output amplifier;
feeding back an output of said second scaled replica and comparing it with a low reference voltage to produce a second closed loop that causes said second scaled replica output to be substantially the same as said low reference voltage; and
clamping said node between said pulse forming circuit and said buffer circuit to a corresponding node within said second closed loop to produce driver pulses having a low voltage level substantially the same as said low reference voltage.

* * * * *